United States Patent
Iwamoto (10) Patent No.: US 7,158,908 B2
(45) Date of Patent: Jan. 2, 2007

(54) TEST APPARATUS, DIAGNOSING PROGRAM AND DIAGNOSING METHOD THEREFOR

(75) Inventor: Satoshi Iwamoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/137,861

(22) Filed: May 25, 2005

(65) Prior Publication Data

US 2006/0259264 A1    Nov. 16, 2006

(30) Foreign Application Priority Data

May 12, 2005    (JP)    ............... 2005-139651

(51) Int. Cl.
*G06F 19/00*    (2006.01)
(52) U.S. Cl. .................. 702/117; 702/121; 702/183; 714/25
(58) Field of Classification Search ................ 702/119, 702/121, 183; 701/29; 705/26, 28, 400; 714/25, 30, 724, 738; 717/126
See application file for complete search history.

(56) References Cited

U.S. PATENT DOCUMENTS 5,036,479 A * 7/1991 Prednis et al. .............. 702/121
5,357,519 A * 10/1994 Martin et al. ................. 714/25

FOREIGN PATENT DOCUMENTS

| JP | 6-281692 | 10/1994 |
|---|---|---|
| JP | 10-150082 | 6/1998 |
| JP | 11-304880 | 11/1999 |
| JP | 2002-174674 | 6/2002 |

OTHER PUBLICATIONS

Semiconductor Test Consortium, "STC Announces Public Access to the Openstar™ Specs," [online], Dec. 7, 2004, URL: http://www.semitest.org/site/News/STC_Spec_Open_to_Public>, printed May 13, 2005, 1 page.
International Search Report for Application No. PCT/JP2006/308234, dated Jul. 25, 2006 (3 pages).
Written Opinion for Application No. PCT/JP2006/308234, dated Jul. 25, 2006 (3 pages).
Patent Abstracts of Japan; English Translation of Publication No. 11-304880 dated May 11, 1999.
Patent Abstracts of Japan; English Translation of Publication No. 10/150082 dated Feb. 6, 1998.
Patent Abstracts of Japan; English Translation of Publication No. 06/281692 dated Jul. 10, 1994.

* cited by examiner

*Primary Examiner*—John Barlow
*Assistant Examiner*—John Le
(74) *Attorney, Agent, or Firm*—Osha Liang LLP (57) ABSTRACT

There is provided a test apparatus having a plurality of test modules. The test apparatus stores object diagnosing programs for controlling diagnosis of the object test module to be diagnosed of a certain type per type of the test module to be diagnosed and stores, separately from it, a set of identification information of diagnostic performance board to be mounted on a test head to diagnose the object test module to be diagnosed by the respective object diagnosing programs per type of the object test modules to be diagnosed. When the diagnostic performance board is mounted on the test head, the test apparatus obtains identification information of the diagnostic performance board and executes the object diagnosing program corresponding to that type under the condition that the identification information coincides with the identification information stored correlatively with the type of the designated object test module to be diagnosed.

7 Claims, 8 Drawing Sheets

TEST APPARATUS, DIAGNOSING PROGRAM AND DIAGNOSING METHOD THEREFOR

The present application claims priority from a Japanese Patent application No. 2005-139651 filed on May 12, 2005, the contents of which are incorporated herein by reference.

BACKGROUND OF THE INVENTION

1. Field of the Invention

The present invention relates to a test apparatus, a diagnosing program and diagnosing method for diagnosing test modules for testing devices-under-test (or DUT).

2. Description of Related Art

Conventionally, a test apparatus for testing DUTs (Devices-Under-Test) such as a memory, a logic LSI or an SOC (System on Chip) carries a plurality of test modules that receives/outputs signals from/to the DUTs. The late test apparatuses are provided with slots capable of carrying a plurality of compatible test modules, thus permitting various tests to be conducted by changing test modules to be inserted into the slots. See the following documents for example.

Semiconductor Test Consortium, "STC ANNOUNCES PUBLICATION ACCESS TO THE OPENSTAR™ SPECS" [online], Dec. 7, 2004 [Retrieved on Mar. 16, 2005], INTERNET <URL: http//www.semitest.org/site/News/STC_Spec_Open_to_Pub lic>

If each test module causes a trouble here, the device-under-test cannot be tested adequately because input and output signals cannot be transmitted correctly.

In order to deal with such trouble, a diagnosing program for diagnosing the test module is prepared per each test module. Then, the test apparatus realizes its diagnostic function for diagnosing the corresponding test module by executing the diagnosing program. In concrete, in diagnosing the test module to be diagnosed, the test apparatus carries out input/output tests or the like by inputting a diagnosing signal output by the test module to another test module to compare it with an expectation value and by inputting a diagnosing signal output by the other test apparatus to the test module to compare with an expectation value.

In order to realize such diagnostic function, a test head of the test apparatus is arranged so as to be able to mount a diagnostic performance board for diagnosing the test modules instead of a performance board for mounting the DUTs. For instance, the diagnostic performance board diagnoses input/output functions of the test modules by receiving a signal to be output to the DUT from each test module and by outputting the input signal to the other test module.

In order to diagnose the test module adequately, an input signal or the like set in advance must be input to the test module at adequate timing. Therefore, the diagnostic performance board to be mounted on the test head must be designed adequately corresponding to the test module to be diagnosed. Accordingly, the conventional diagnosing program for controlling the diagnostic process diagnoses the test module after discriminating the type of the diagnostic performance board currently mounted on the test head and only when the diagnostic performance board of that type is suitable for diagnosing the test module.

In diagnosing a certain test module, there is a case of using an upward compatible performance board developed for the improved version of the test module, not only the performance board developed for only diagnosing the test module. However, the type of the performance board for only diagnosing the test module is different from the upward compatible performance board.

Accordingly, the conventional diagnosing program could not diagnose the test modules by using the upward compatible performance board. Still more, in order to make it possible to diagnose by using the upward compatible performance board, the diagnosing program must be prepared over again every time when such performance board is developed.

It is therefore an object of the invention to provide a test apparatus and a program capable of solving the above-mentioned problems. This object may be achieved by combining features described in independent claims. Dependent claims speculate still advantageous embodiments.

SUMMARY OF INVENTION

In order to solve the above-mentioned problems, according to a first aspect of the invention, there is provided a test apparatus for testing devices-under-test, having a plurality of test modules for supplying a test signal to the device-under-test and receiving an output signal output by the device-under-test corresponding to the supplied test signal, a test head for carrying a testing performance board that carries the device-under-test and connects the mounted device-under-test with the plurality of test modules and a control unit for controlling the plurality of test modules, wherein the control unit has a diagnosing program storage section for storing object diagnosing programs that cause the control unit to control the diagnosis of a certain type of object test module to be diagnosed per type thereof, a file storage section for storing a compatible information file recording, per type of the object test module to be diagnosed, identification information of at least one mutually compatible diagnostic performance board to be mounted on the test head instead of the testing performance board to diagnose the object test module to be diagnosed by the respective object diagnosing programs, an identification information obtaining section for obtaining the identification information of the diagnostic performance board when the diagnostic performance board is mounted on the test head and an object diagnosing program executing section for executing the object diagnosing program corresponding to the type under the condition that at least one of the identification information recorded in the compatible information file correlatively with the type of the designated object test module to be diagnosed coincides with the identification information obtained by the identification information obtaining section.

The file storage section may also store a system configuration file recording the respective types of the plurality of test modules mounted on the test apparatus, the control unit has also a type obtaining section for reading out the system configuration file to obtain the type of the respective test modules mounted on the test apparatus and an object diagnosing program selecting section for setting each of the test modules sequentially as the object test modules to be diagnosed and sequentially selecting the object diagnosing programs corresponding to the type of the object test modules to be diagnosed, and the object diagnosing program executing section executes the object diagnosing program selected by the object diagnosing program selecting section under the condition that at least one of the identification information recorded correlatively with the type of the object diagnosing program coincides with the identification information obtained by the identification information obtaining section.

The control unit may also have amount detecting section for detecting that any one of the diagnostic performance boards is mounted on the test head and the identification information obtaining section may obtain the identification information of the diagnostic performance board corresponding to that the diagnostic performance board is detected as being mounted by the mount detecting section.

The control unit may further include a display section for displaying each of the plurality of test modules so that the user can select under the condition that any one of identification information corresponding to the type of the test module in the compatible information file coincides with the identification information obtained by the identification information obtaining section and an object diagnosing program selecting section for selecting an object diagnosing program for diagnosing the test module designated by the user among the test modules displayed on the display section, and the object diagnosing program executing section may execute the object diagnosing program selected by the object diagnosing program selecting section.

The display section may also display the identification information recorded in the compatible information file to the user as information indicating the performance board to be mounted on the test head when none of the identification information recorded in the compatible information file correlatively with the type of the test module designated by the user coincides with the identification information obtained by the identification information obtaining section.

According to a second aspect of the invention, there is provided a diagnosing program for diagnosing test modules by a control unit in a test apparatus having the plurality of test modules that supply a test signal to a device-under-test, the control unit for controlling the plurality of test modules and a test head for carrying a testing performance board that carries the device-under-test and connects the mounted device-under-test with the plurality of test modules, wherein the diagnosing program operates the control unit as a diagnosing program storage section for storing object diagnosing programs that cause the control unit to control the diagnosis of a certain type of the object test module to be diagnosed per type thereof, a file storage section for storing a compatible information file recording identification information of at least one mutually compatible diagnostic performance board to be mounted on the test head instead of the testing performance board to diagnose the object test module to be diagnosed by the respective object diagnosing program per type of the object test module to be diagnosed, an identification information obtaining section for obtaining the identification information of the diagnostic performance board when the diagnostic performance board is mounted on the test head and an object diagnosing program executing section for executing the object diagnosing program corresponding to the type under the condition that at least one of the identification information recorded in the compatible information file correlatively with the type of the designated object test module to be diagnosed coincides with the identification information obtained by the identification information obtaining section.

According to a third aspect of the invention, there is provided a diagnosing method for diagnosing test modules by a control unit in a test apparatus having the plurality of test modules for supplying a test signal to a device-under-test, a control unit for controlling the plurality of test modules and a test head for carrying a testing performance board that carries the device-under-test and connects the mounted device-under-test with the plurality of test modules, wherein the control unit has a diagnosing program storage section for storing object diagnosing programs that cause the control unit to control the diagnosis of a certain type of the object test module to be diagnosed per type thereof and a file storage section for storing a compatible information file recording identification information of at least one mutually compatible diagnostic performance board to be mounted on the test head instead of the testing performance board to diagnose the object test module to be diagnosed by the respective object diagnosing program per type of the object test module to be diagnosed, and the diagnosing method has an identification information obtaining step of obtaining the identification information of the diagnostic performance board when the diagnostic performance board is mounted on the test head and an object diagnosing program executing step of executing the object diagnosing program corresponding to the type under the condition that at least one of the identification information recorded in the compatible information file correlatively with the type of the designated object test module to be diagnosed coincides with the identification information obtained by the identification information obtaining section.

It is noted that the summary of the invention does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
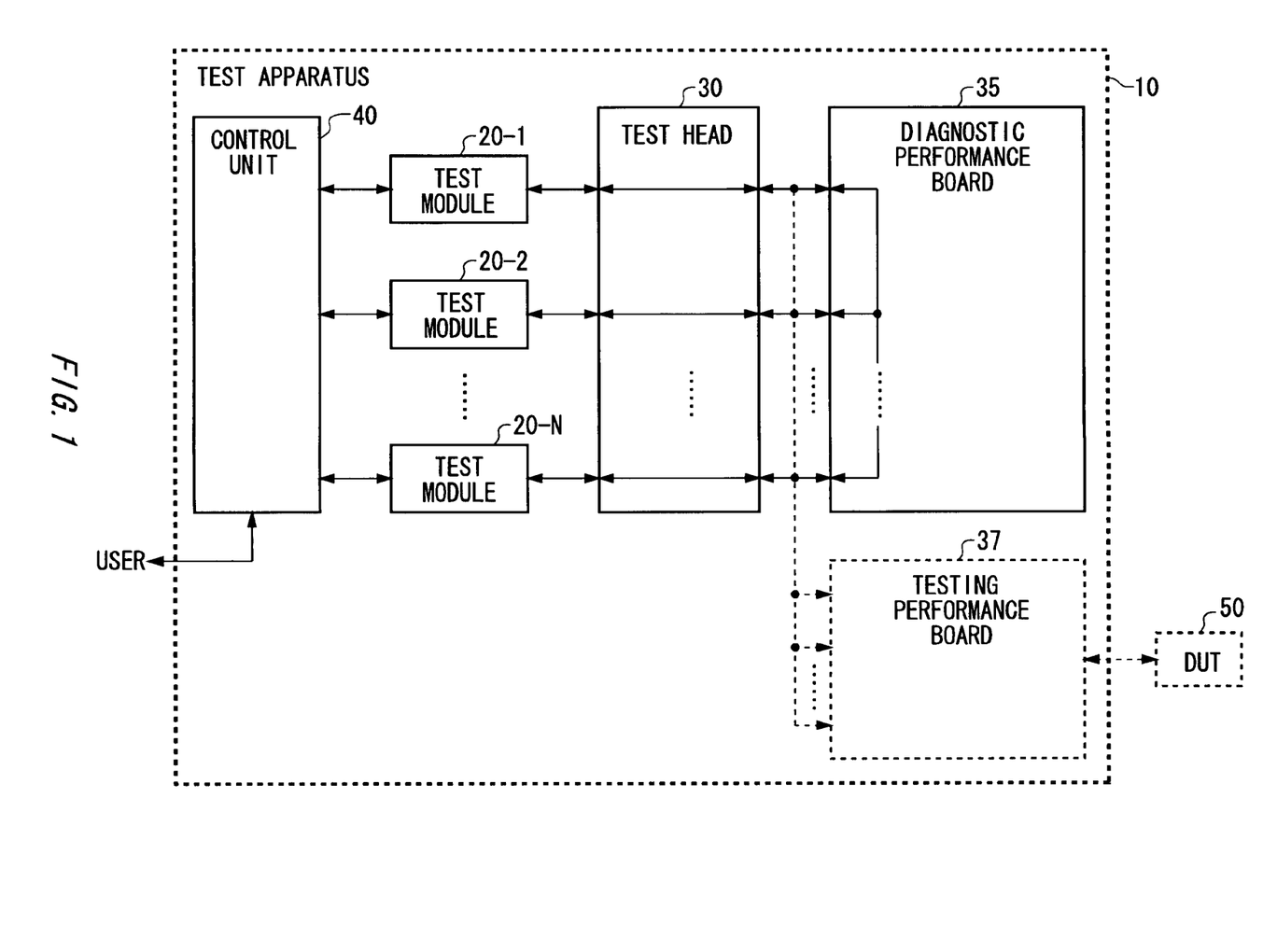
FIG. 1 shows an overall configuration of a test apparatus 10.

FIG. 1 shows an overall configuration of a test apparatus 10. The test apparatus 10 has test modules 20-1 through 20-N, a test head 30, a diagnostic performance board 35, a testing performance board 37 and a control unit 40. Each of the test modules 20-1 through 20-N supplies a test signal to a device-under-test 50 (DUT) and receives an output signal output by the device-under-test 50 corresponding to the supplied test signal. The test head 30 carries the testing performance board 37 that is a performance board for carrying the device-under-test 50. When the testing performance board 37 is mounted on the test head 30, it connects the device-under-test 50 mounted thereon with the test modules 20-1 through 20-N.

Meanwhile, the diagnostic performance board 35 is a performance board to be mounted on the test head 30, instead of the testing performance board 37, to diagnose at least one of the test modules 20-1 through 20-N whether or not it is non-defective. It is not necessary to mount the device-under-test 50 thereon because the diagnostic performance board 35 is not used to judge whether or not the device-under-test 50 is non-defective. The control unit 40 judges whether or not the device-under-test 50 is non-defective when the testing performance board 37 is mounted and judges whether or not the test modules 20-1 through 20-N are non-defective when the diagnostic performance board 35 is mounted.

It is noted that the test apparatus 10 in the figure may be composed of a host computer for controlling tests and a test unit for inputting/outputting test signals from/to the device-under-test 50 for example. In this case, the control unit 40 may be realized by the host computer and the test modules 20-1 through 20-N and the test head 30 are provided in the test unit. Or, at least a part of functions of the respective test modules 20-1 through 20-N may be realized by the host computer.

An object of the test apparatus 10 of the present embodiment is to diagnose whether or not the testing function of the test modules 20-1 through 20-N for use in testing the device-under-test 50 works normally in the ordinary operation. Controls conducted when the diagnostic performance board 35 is mounted on the test head 30 will be explained hereinbelow.

Figure 2:
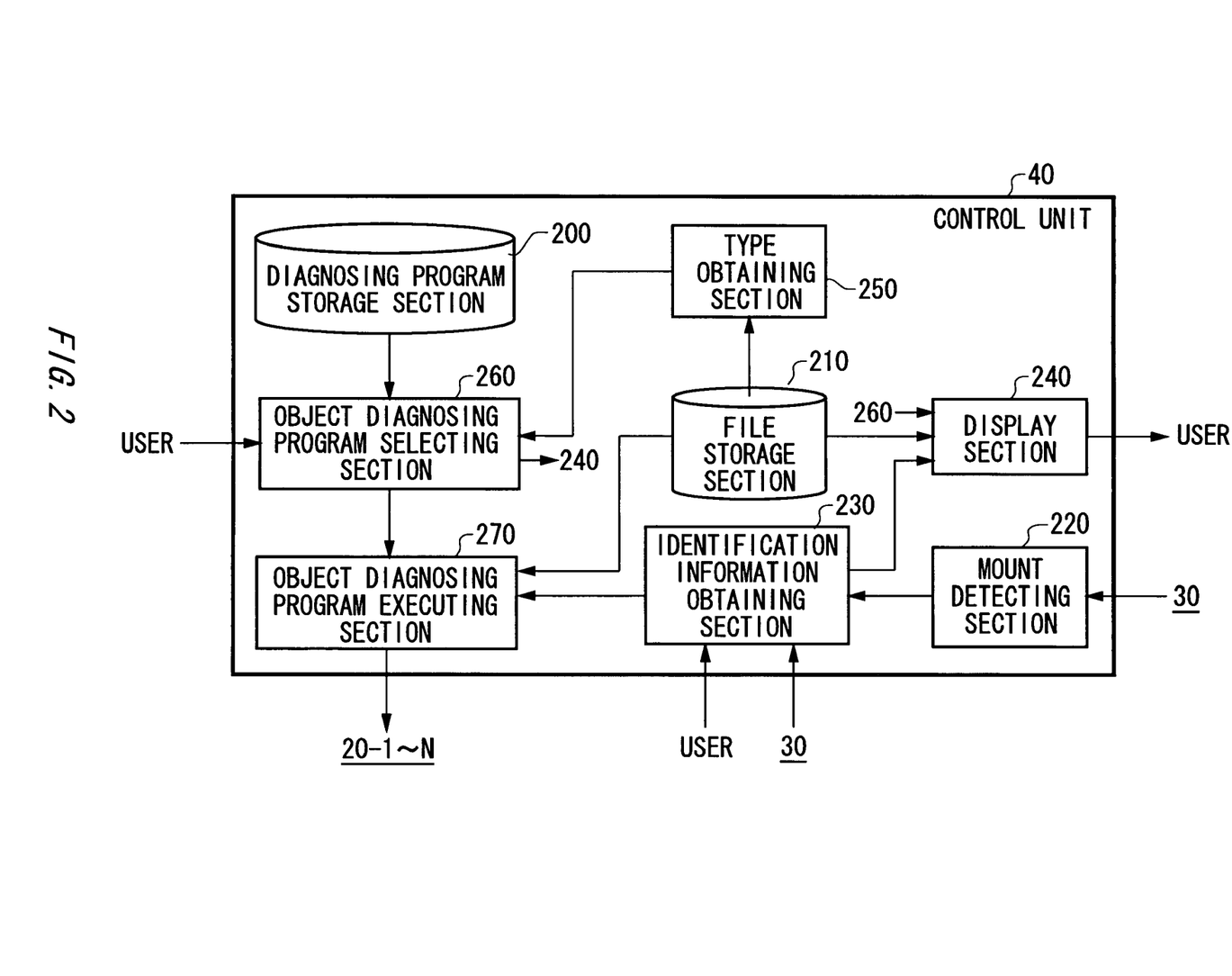
FIG. 2 shows functions of a control unit 40 by functional blocks.

FIG. 2 shows functions of the control unit 40 by functional blocks. The control unit 40 has a diagnosing program storage section 200, a file storage section 210, amount detecting section 220, an identification information obtaining section 230, a display section 240, a type obtaining section 250, an object diagnosing program selecting section 260 and an object diagnosing program executing section 270. The diagnosing program storage section 200 stores object diagnosing programs for controlling diagnosis of a certain type of an object test module to be diagnosed by the control unit 40 per type of the test module to be diagnosed.

The file storage section 210 stores a compatible information file recording information regarding compatibility of the diagnostic performance boards. More specifically, the compatible information file records identification information of at least one mutually compatible diagnostic performance board to be mounted on the test head 30 instead of the testing performance board 37 to diagnose the object test module to be diagnosed by the respective object diagnosing programs per type of the object test module to be diagnosed. The file storage section 210 also stores a system configuration file recording the respective types of the test modules 20-1 through 20-N mounted on the control unit 40.

The mount detecting section 220 detects if any diagnostic performance board is mounted on the test head 30. Corresponding to the result detected by the mount detecting section 220 that the diagnostic performance board is been mounted, the identification information obtaining section 230 obtains identification information of that diagnostic performance board. Instead of that, the identification information obtaining section 230 may obtain the identification information corresponding to an instruction given by an user, regardless whether the diagnostic performance board is been mounted or not. Based on the identification information obtained by the identification information obtaining section 230, the display section 240 displays diagnosable test modules among test modules recorded in the system configuration file so that the user can select.

The type obtaining section 250 reads the system configuration file from the file storage section 210 to obtain the type of the test modules 20-1 through 20-N mounted on the control unit 40. When the object diagnosing program selecting section 260 receives an instruction to diagnose all the test modules, it sets each of the test modules 20-1 through 20-N sequentially as test modules to be diagnosed and selects sequentially the object diagnosing programs corresponding to the type of the test modules to be diagnosed. When the object diagnosing program selecting section 260 receives an instruction to designate a specific test module as an object to be diagnosed on the other hand, it selects an object diagnosing program corresponding to the type of that test module. In this case, the display section 240 may display information indicating another performance board to be mounted to the user under the condition that the selected object diagnosing program cannot be executed in the state when the diagnostic performance board 35 is mounted.

The object diagnosing program executing section 270 obtains identification information of the performance board recorded correlatively with the type of the designated object test module to be diagnosed from the compatible information file. Then, the object diagnosing program executing section 270 executes the object diagnosing program selected by the object diagnosing program selecting section 260 under the condition that at least one of the obtained identification information coincides with the identification information obtained by the identification information obtaining section 230.

Figure 3:
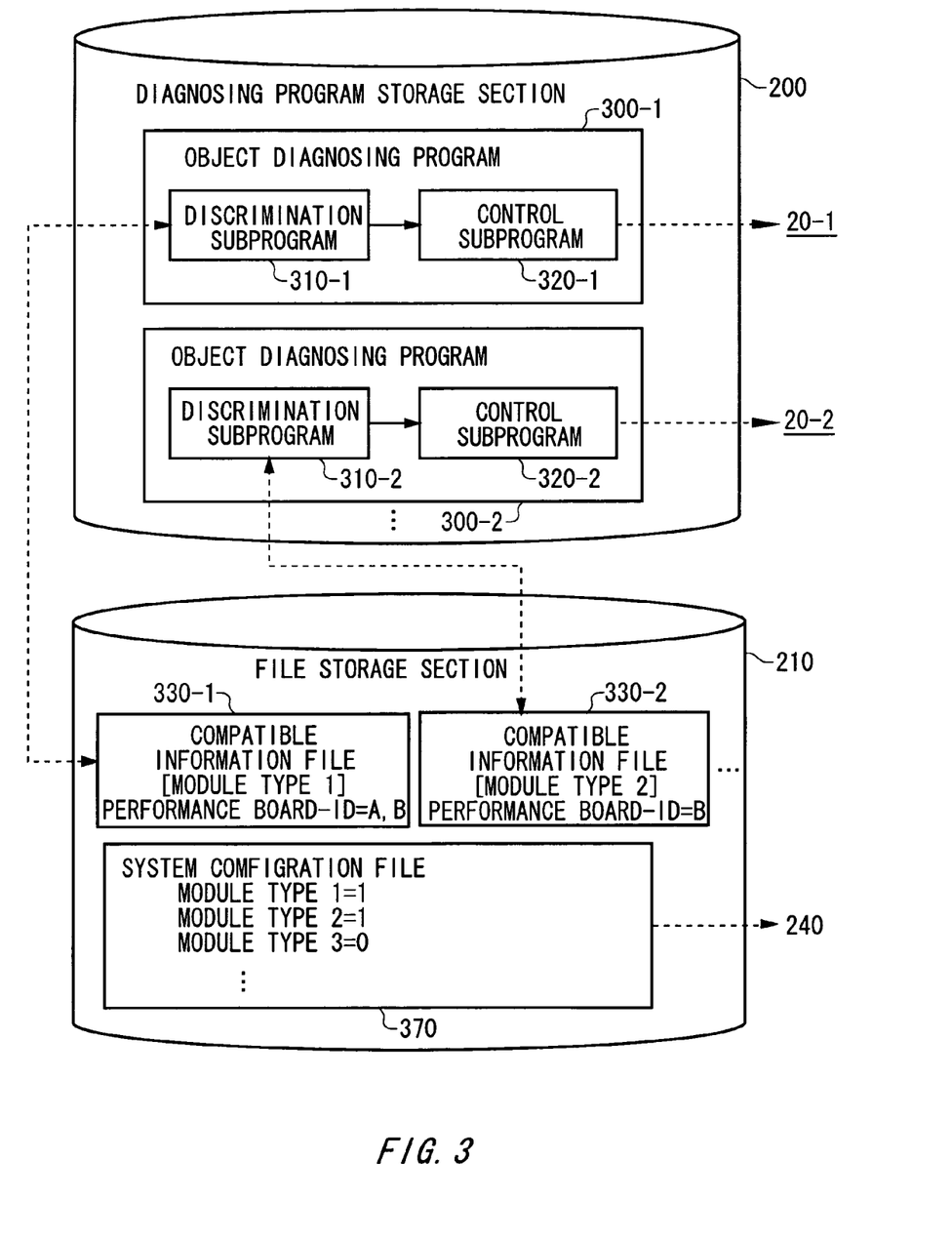
FIG. 3 shows a first exemplary configuration of various data stored in a diagnosing program storage section 200 and a file storage section 210.

FIG. 3 shows a first exemplary configuration of various data stored in the diagnosing program storage section 200 and the file storage section 210. The diagnosing program storage section 200 stores an object diagnosing program 300-1 for controlling diagnosis of the test module of a certain type corresponding to the type of the test module 20-1 and an object diagnosing program 300-2 for controlling diagnosis of the test module of a certain type corresponding to the type of the test module 20-2. The object diagnosing program 300-1 contains a discrimination subprogram 310-1 and a control subprogram 320-1 and the object diagnosing program 300-2 contains a discrimination subprogram 310-2 and a control subprogram 320-2. The discrimination subprogram 310-1, the control subprogram 320-1, the discrimination subprogram 310-2 and the control subprogram 320-2 are read by the object diagnosing program selecting section 260 and are executed by the object diagnosing program executing section 270, respectively.

The file storage section 210 stores a compatible information file 330-1 and a compatible information file 330-2 recording information regarding the compatibility of the performance boards and a system configuration file 370 recording the types of test modules mounted on the control unit 40. The compatible information file 330-1 is provided corresponding to Module Type 1 which is the type of the test module 20-1. Then, the compatible information file 330-1 records A and B as identification information (ID) of the performance board (PB) to be mounted on the test head 30 to diagnose the test module of the Module Type 1. The compatible information file 330-2 is provided corresponding to Module Type 2 which is the type of the test module 20-2. Then, the compatible information file 330-2 records B as identification information (ID) of the performance board (PB) to be mounted on the test head 30 to diagnose the test module of the Module Type 2.

Based on the control of the discrimination subprogram 310-1, the object diagnosing program executing section 270 judges whether or not at least one of the identification information recorded in the compatible information file 330-1 coincides with the identification information obtained by the identification information obtaining section 230. When they coincides each other, the object diagnosing program executing section 270 transmits a control signal for diagnosing the test module 20-1 to the test module 20-1 under the control of the control subprogram 320-1. That is, if the identification information obtained by the identification information obtaining section 230 is A or B, the object diagnosing program executing section 270 can start the diagnosis of the test module 20-1.

Similarly to that, the object diagnosing program executing section 270 judges whether or not at least one of the identification information recorded in the compatible information file 330-2 coincides with the identification information obtained by the identification information obtaining section 230 based on the control of the discrimination subprogram 310-2. When they coincide each other, the object diagnosing program executing section 270 transmits a control signal for diagnosing the test module 20-2 to the test module 20-2 based on the control of the control subprogram 320-2. That is, if the identification information obtained by the identification information obtaining section 230 is B, the object diagnosing program executing section 270 can start the diagnosis of the test module 20-2.

Thus, the configuration explained in the figure allows the compatible information files and the object diagnosing programs to be recorded as separate files, so that it allows a burden of works for updating the information regarding the compatibility of the diagnostic performance boards to be reduced.

Still more, the system configuration file 370 records the types of the plurality of test modules mounted on the control unit 40, respectively. For instance, in the example of the figure, the system configuration file 370 records a numerical value 1 by correlating with the type of the test module mounted on the control unit 40 and records a numerical value 0 by correlating with the type of the test module not mounted on the control unit 40. That is, the test modules of Module Types 1 and 2 are mounted on the control unit 40 and the test module of Module Type 3 is not mounted on the control unit 40.

It allows the types of the mounted test modules to be readily discriminated.

Figure 4:
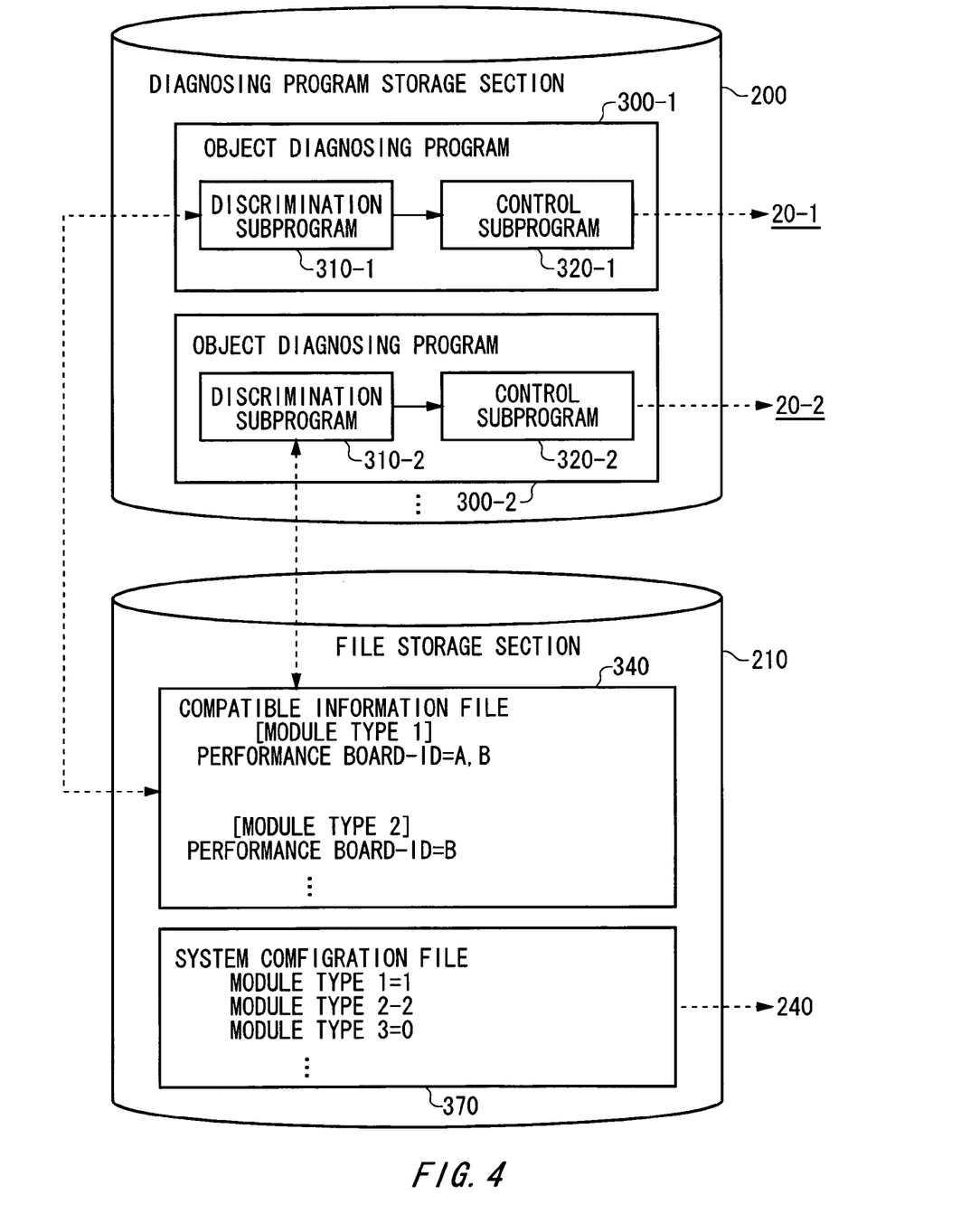
FIG. 4 shows a second exemplary configuration of various data stored in the diagnosing program storage section 200 and the file storage section 210.

FIG. 4 shows a second exemplary configuration of various data stored in the diagnosing program storage section 200 and the file storage section 210. Similarly to the first exemplary configuration in Fig. 3, the diagnosing program storage section 200 of this example stores the object diagnosing program 300-1 and the object diagnosing program 300-2. The configuration and function of the object diagnosing program 300-1 and the object diagnosing program 300-2 have been already explained in connection with FIG. 3, so that their explanation will be omitted here. Meanwhile, the file storage section 210 stores a compatible information file 340 instead of the compatible information file 330-1 and the compatible information file 330-2 in FIG. 3.

The compatible information file 340 records both IDs of a performance board to be mounted on the test head 30 to diagnose the test module of Module Type 1 and of a performance board to be mounted on the test head 30 to diagnose the test module of Module Type 2 within one file. Such configuration allows information regarding the compatibility of the diagnostic performance boards to be updated just by conducting works for editing one file.

Figure 5:
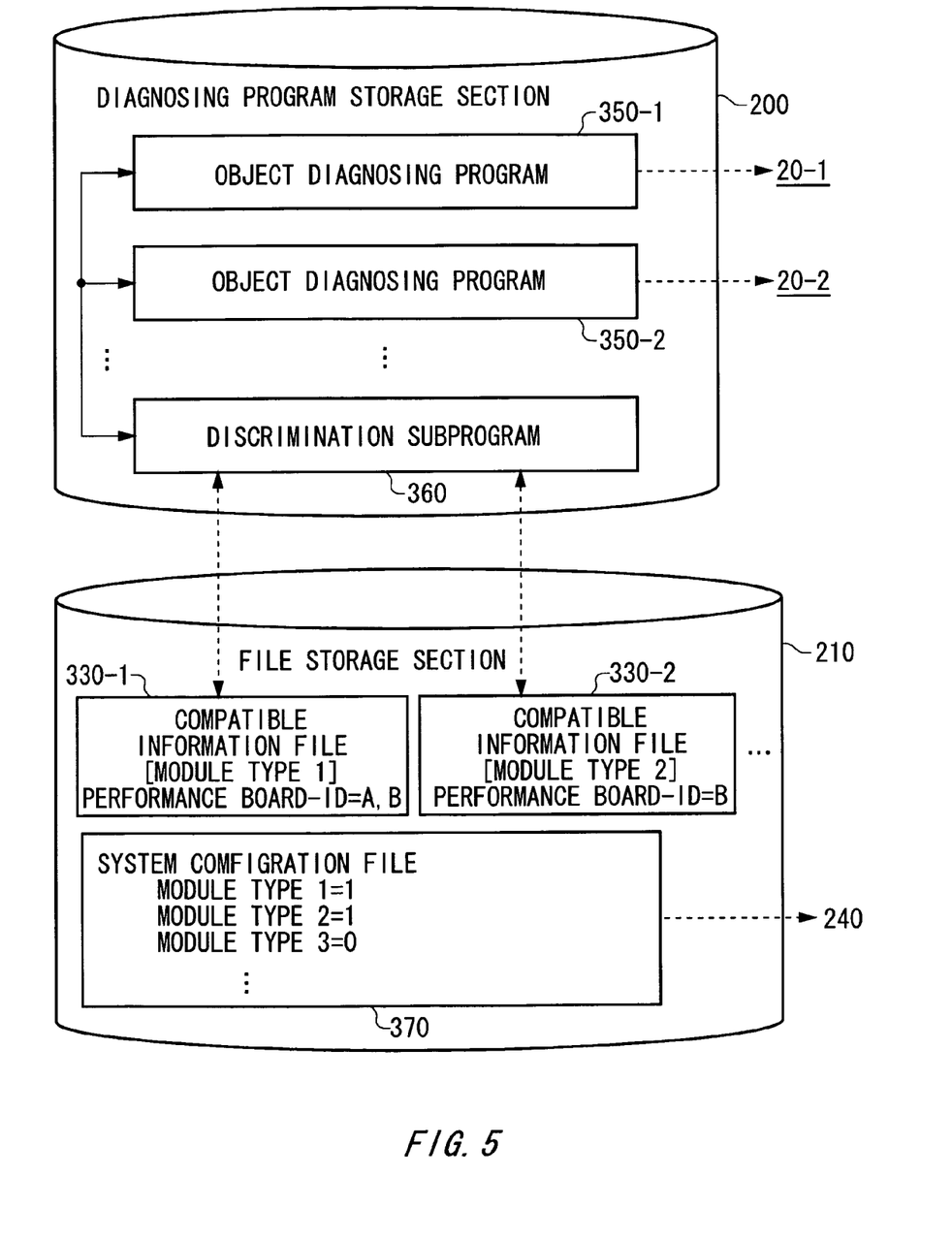
FIG. 5 shows a third exemplary configuration of various data stored in the diagnosing program storage section 200 and the file storage section 210.

FIG. 5 shows a third exemplary configuration of various data stored in the diagnosing program storage section 200 and the file storage section 210. Similarly to the first exemplary configuration in FIG. 3, the file storage section 210 of this example stores the compatible information file 330-1, the compatible information file 330-2 and the system configuration file 370. The configuration of the compatible information file 330-1, the compatible information file 330-2 and the system configuration file 370 have been already explained in connection with FIG. 3, so that their explanation will be omitted here. Meanwhile, differing from the first exemplary configuration in FIG. 3, the diagnosing program storage section 200 stores the object diagnosing program 350-1, the object diagnosing program 350-2 and the discrimination program 360 respectively as separate files.

Based on the control of the discrimination program 360, the object diagnosing program executing section 270 judges whether or not at least one of the identification information recorded in the compatible information file 330-1 coincides with the identification information obtained by the identification information obtaining section 230. Still more, based on the control of the discrimination program 360, the object diagnosing program executing section 270 judges whether or not at least one of the identification information recorded in the compatible information file 330-2 coincides with the identification information obtained by the identification information obtaining section 230. The respective judged results are sent to the object diagnosing program 350-1 and the object diagnosing program 350-2.

Then, based on the control of the object diagnosing program 350-1, the object diagnosing program executing section 270 transmits a control signal for diagnosing the test module 20-1 to the test module 20-1. Still more, based on the control of the object diagnosing program 350-2, the object diagnosing program executing section 270 transmits a control signal for diagnosing the test module 20-2 to the test module 20-2. Thus, the program for discriminating the compatibility of the performance boards is made common as a program module common to the respective object diagnosing programs in this exemplary configuration. This exemplary configuration allows works to be carried out in altering or modifying the processes for diagnosing the test modules without influencing to the compatibility discriminating function and allows works to be carried out in altering or modifying the compatibility discriminating function without influencing to the processes for diagnosing the test modules.

Figure 6:
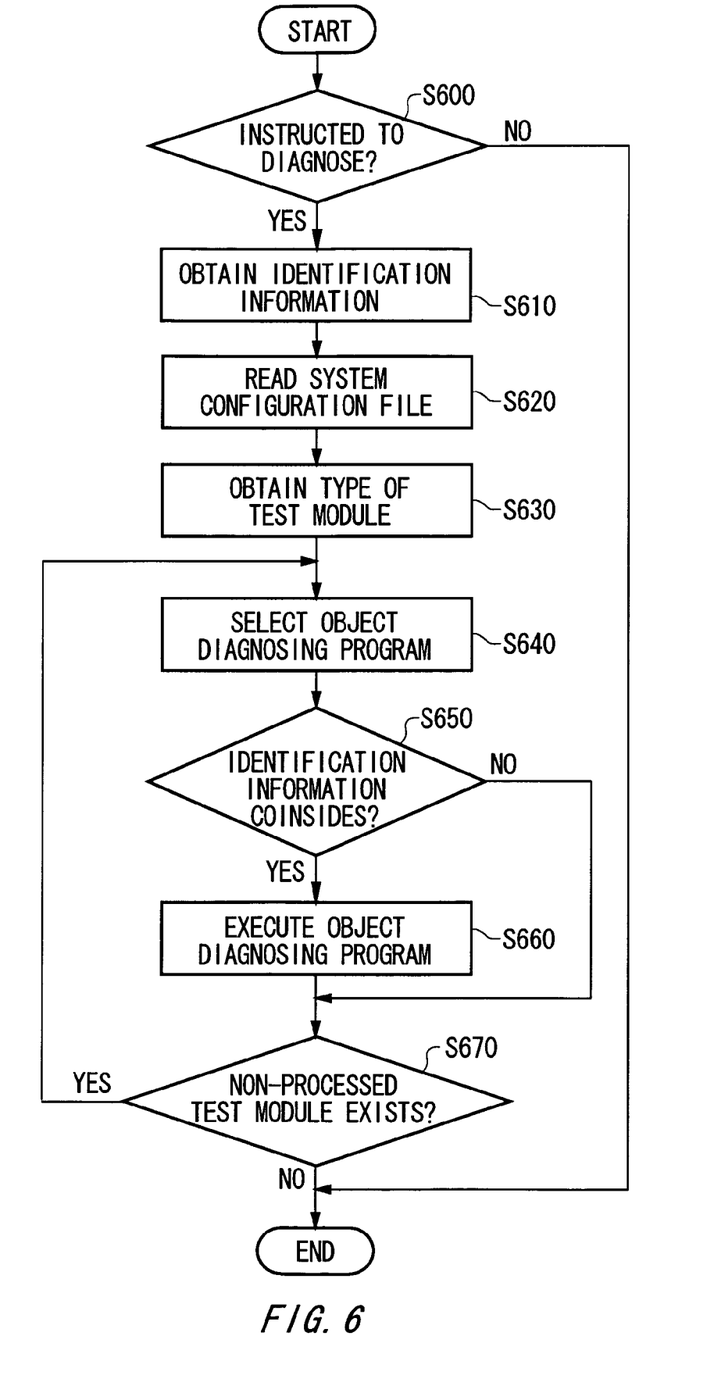
FIG. 6 shows one example of processes through which the control unit 40 diagnoses a test module.

FIG. 6 shows one example of processes through which the control unit 40 diagnoses test modules. By receiving an instruction to sequentially diagnose the entire test modules mounted on the test apparatus 10 (S600: YES), the identification information obtaining section 230 obtains identification information of the diagnostic performance board 35 (S610). Then, the type obtaining section 250 reads the system configuration file 370 (S620) and obtains the type of the test modules 20-1 through 20-N mounted on the test apparatus 10 (S630). The object diagnosing program selecting section 260 designates each of the test modules 20-1 through 20-N sequentially as an object test module to be diagnosed and selects an object diagnosing program corresponding to the type of the object test module to be diagnosed (S640). The object diagnosing program corresponding to each of test modules may be determined in advance or may be determined by another determination file stored further in the file storage section 210.

Under the condition that at least one of the identification information recorded in the compatible information file 330-1 and or the like correlatively with the type of the designated object test module to be diagnosed coincides with the identification information obtained by the identification information obtaining section 230 (S650: YES), the object diagnosing program executing section 270 executes the selected object diagnosing program (S660). When there still remains a test module not selected yet as an object of the diagnostic process among the test modules recorded in the system configuration file 370 (S670: YES), the process is returned to S640 to select all the test modules sequentially.

When all of the plurality of test modules mounted on the test apparatus 10 have been already selected as objects for the diagnostic process on the other hand (S670: NO), the control unit 40 ends the processes in the figure.

As described above, the processes in the figure allow only the test modules that can be diagnosed by using the performance board currently mounted on the test head 30 to be automatically selected and be diagnosed among all the test modules mounted on the test apparatus 10.

Figure 7:
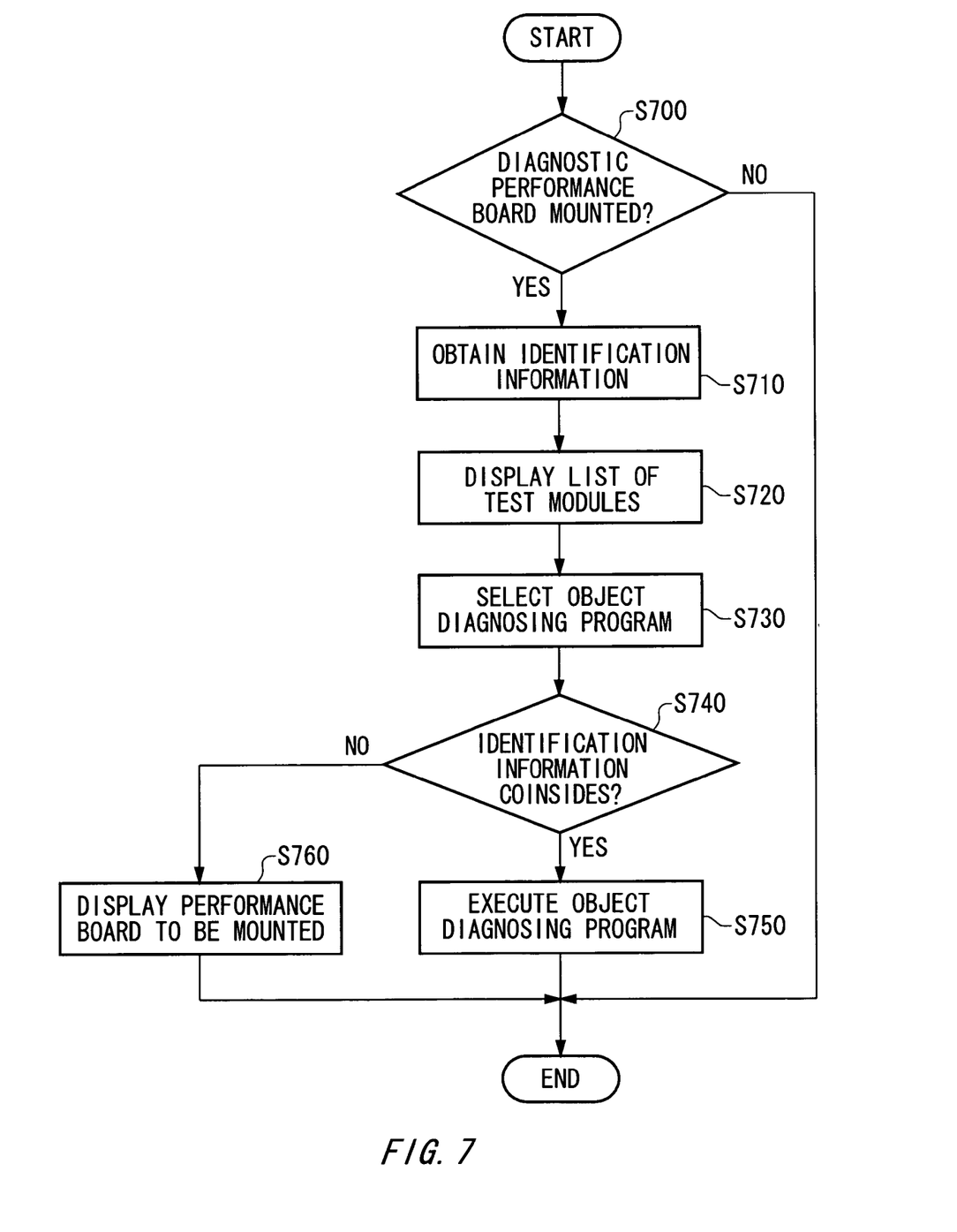
FIG. 7 shows another example of processes through which the control unit 40 diagnoses the test module.

FIG. 7 shows another example of processes through which the control unit 40 diagnoses the test modules. Corresponding to the result detected by the mount detecting section 220 that the diagnostic performance board is been mounted (S700: YES), the identification information obtaining section 230 obtains the identification information of that diagnostic performance board (S710). Then, the display section 240 displays each of the plurality of test modules mounted on the test apparatus 10 (S720) under the condition that any one of the identification information corresponding to the type of the test module in the system configuration file 370 coincides with the identification information obtained by the identification information obtaining section 230. For instance, the display section 240 displays a list of IDs of the respective test modules meeting with the above-mentioned condition on a screen correlatively with check boxes so that the user can select. In addition to that, the display section 240 may display ID of each test module that does not meet with the above-mentioned condition by graying out (display by gray letters so as to indicate that it is not selectable).

The object diagnosing program selecting section 260 sets the test modules designated by the user among the test modules displayed by the display section 240 as object test modules to be diagnosed and selects the object diagnosing programs for diagnosing the object test modules to be diagnosed (S730). Under the condition that at least one of the identification information recorded in the compatible information file correlatively with the type of the object test modules to be diagnosed coincides with the identification information obtained by the identification information obtaining section 230, the object diagnosing program executing section 270 executes the selected object diagnosing program (S750).

When none of the identification information recorded in the compatible information file 330-1 or the like correlatively with the type of the test modules designated by the user coincides with the identification information obtained by the identification information obtaining section 230 (S740: NO) on the other hand, the display section 240 reads the identification information recorded correlatively with the type of the designated test modules from the compatible information file 330-1 or the like and displays at least one of them as information indicating a performance board to be mounted on the test head 30 (S760).

Figure 8:
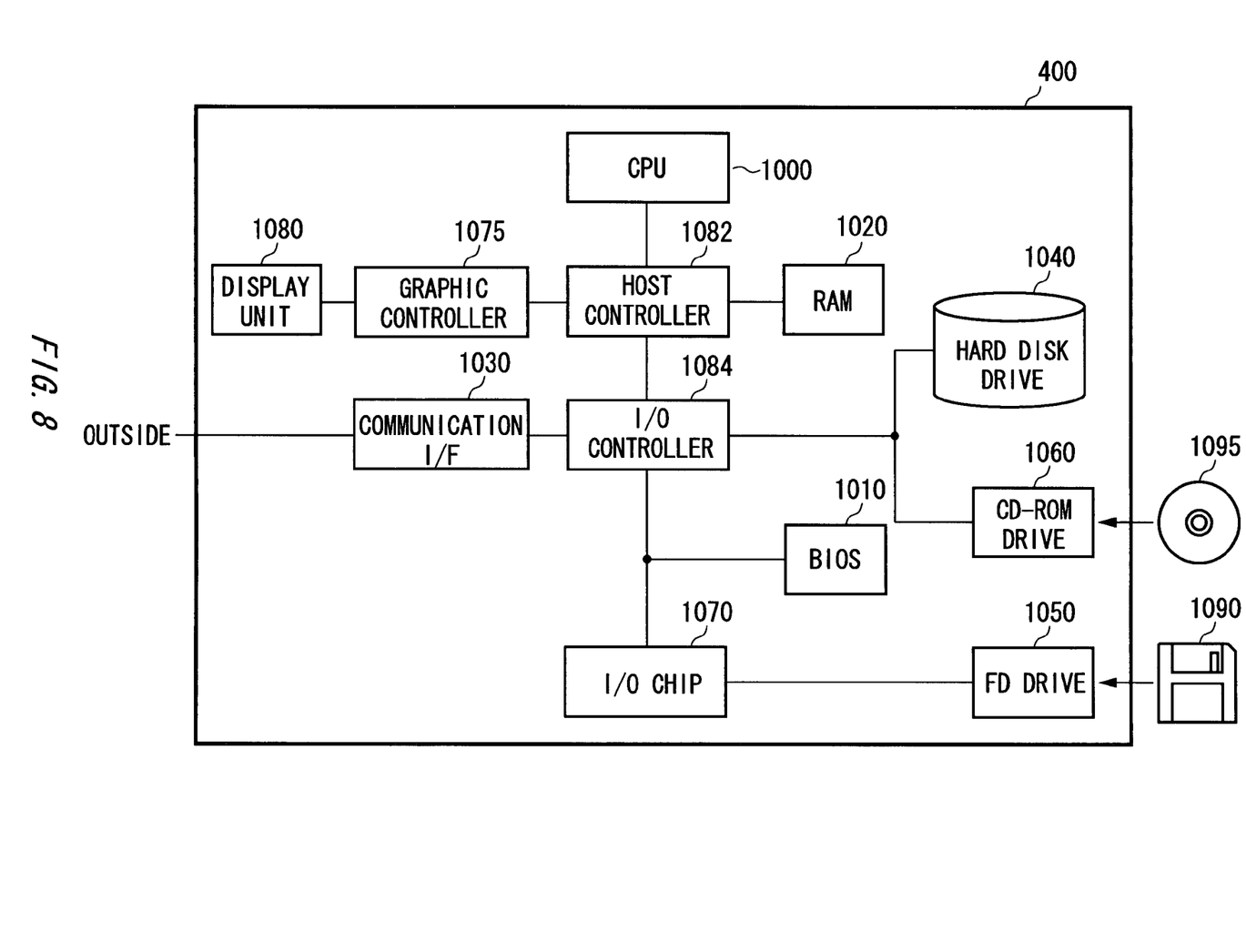
FIG. 8 shows one example of a hardware configuration of an information processing unit 400 functioning as the control unit 40.

FIG. 8 shows one example of a hardware configuration of an information processing unit 400 that functions as a host computer composing the control unit 40. The information processor 400 has a CPU peripheral sections including a CPU 1000, a RAM 1020 and a graphic controller 1075 mutually connected by a host controller 1082, an input/output section including a communication interface 1030 connected with the host controller 1082 via an input/output controller 1084, a hard disk drive 1040 and a CD-ROM drive 1060, and a legacy input/output section including a ROM 1010, a flexible disk drive 1050 and an input/output chip 1070 connected with the input/output controller 1084.

The host controller 1082 connects the RAM 1020 with the CPU 1000 and the graphic controller 1075 that access to the RAM 1020 at high transfer rate. The CPU 1000 is operative based on programs stored in the ROM 1010 and the RAM 1020 to control the respective sections. The graphic controller 1075 obtains image data generated by the CPU 1000 and the like on a frame buffer provided within the RAM 1020 to display on a display unit 1080. Instead of that, the graphic controller 1075 may contain a frame buffer for storing image data generated by the CPU 1000 and the like.

The input/output controller 1084 connects the host controller 1082 with the communication interface 1030, the hard disk drive 1040 and the CD-ROM drive 1060 which are input/output units of relatively high rate. The communication interface 1030 communicates with external units via a network. The hard disk drive 1040 stores programs and data used by the information processor 400. The CD-ROM drive 1060 reads the programs or data from a CD-ROM 1095 and supplies it to the RAM 1020 or the hard disk drive 1040.

The input/output controller 1084 is connected with the relatively low rate input/output units such as the ROM 1010, the flexible disk drive 1050 and the input/output chip 1070. The ROM 1010 stores a boot program executed by the CPU 1000 when the information processor 400 starts and programs dependent on the hardware of the information processor 400. The flexible disk drive 1050 reads programs or data from the flexible disk 1090 and supplies it to the RAM 1020 or the hard disk drive 1040 via the input/output chip 1070. The input/output chip 1070 connects the flexible disk 1090 with the various input/output units via parallel ports, serial ports, a keyboard port and a mouse port for example.

The information processor 400 is also provided with the diagnosing programs for diagnosing the test modules 20-1 through 20-N by the control unit 40. The diagnosing programs include the object diagnosing programs 300-1 and 300-2, object diagnosing programs 350-1 and 350-2 and the discrimination program 360. These programs are stored in the flexible disk 1090, the CD-ROM 1095 or a recording medium such as an IC card to be provided by the user. The programs are read from the recording medium via the input/output chip 1070 and/or the input/output controller 1084 and are installed in the information processor 400 to be executed. Operations of the programs executed by the information processor 400 and the like are the same with those of the control unit 40 explained in connection with FIGS. 1 through 7, so that their explanation will be omitted here.

The programs described above may be stored in an external recording medium. As the recording medium, an optical recording medium such as DVD and PD, an magneto-optic recording medium such as MD, a taped medium and a semiconductor memory such as an IC card may be used beside the flexible disk 1090 and the CD-ROM 1095. Still more, a storage unit such as a hard disk and a RAM provided in a server system connected with a dedicated communication network or Internet may be used as the recording medium and the programs may be supplied to the information processor 400 via the network.

The test apparatus 10 of the present embodiment records the information indicating the compatibility of the performance boards as files separately from the programs for conducting the processes for diagnosing the test modules as described above. It allows the burden of works to be reduced in changing setting of a newly developed diagnostic performance board so that it can be used for testing the existing test module.

Although the invention has been described by way of the exemplary embodiments, it should be understood that those skilled in the art might make many changes and substitutions without departing from the spirit and the scope of the invention. It is obvious from the definition of the appended claims that the embodiments with such modifications also belong to the technological scope of the invention.

As it is apparent from the explanation described above, the invention allows the setting information determining the diagnostic performance board that can be used for diagnosing the various test modules to be changed with less burden of works than before.

What is claimed is:

1. A test apparatus for testing devices-under-test, comprising:
a plurality of test modules for supplying a test signal to said device-under-test and receiving an output signal output by said device-under-test corresponding to the supplied test signal;
a test head for carrying a testing performance board that carries said device-under-test and connects said mounted device-under-test with said plurality of test modules; and
a control unit for controlling said plurality of test modules: wherein said control unit has:
a diagnosing program storage section for storing object diagnosing programs for causing said control unit to control the diagnosis of a certain type of the object test module to be diagnosed per type thereof;
a file storage section for storing a compatible information file recording, per type of the object test module to be diagnosed, identification information of at least one mutually compatible diagnostic performance board to be mounted on said test head instead of said testing performance board to diagnose said object test module to be diagnosed by the respective object diagnosing program;
an identification information obtaining section for obtaining the identification information of said diagnostic performance board when said diagnostic performance board is mounted on said test head; and
an object diagnosing program executing section for executing said object diagnosing program corresponding to the type under the condition that at least one of the identification information recorded in said compatible information file correlatively with the type of said designated object test module to be diagnosed coincides with the identification information obtained by said identification information obtaining section.

2. The test apparatus as set forth in claim 1, wherein said file storage section also stores a system configuration file recording the respective types of said plurality of test modules mounted on said test apparatus;
said control unit further comprises:
a type obtaining section for reading out said system configuration file to obtain the type of said respective test modules mounted on said test apparatus; and
an object diagnosing program selecting section for setting each of said test modules sequentially as said object test modules to be diagnosed and sequentially selecting said object diagnosing programs corresponding to the type of said object test modules to be diagnosed; and
said object diagnosing program executing section executes said object diagnosing program selected by said object diagnosing program selecting section under the condition that at least one of the identification information recorded correlatively with the type of the object diagnosing program coincides with the identification information obtained by said identification information obtaining section.

3. The test apparatus as set forth in claim 1, wherein said control unit has further a mount detecting section for detecting that any one of said diagnostic performance boards is mounted on said test head; and said identification information obtaining section obtains the identification information of the diagnostic performance board corresponding to that the diagnostic performance board is detected as being mounted by said mount detecting section.

4. The test apparatus as set forth in claim 1, wherein said control unit further comprises:
a display section for displaying each of said plurality of test modules so that the user can select under the condition that any one of the identification information corresponding to the type of the test module in said compatible information file coincides with the identification information obtained by said identification information obtaining section; and
an object diagnosing program selecting section for selecting an object diagnosing program for diagnosing the test module designated by the user among the test modules displayed on said display section; and
said object diagnosing program executing section executes the object diagnosing program selected by said object diagnosing program selecting section.

5. The test apparatus as set forth in claim 4, wherein said display section displays the identification information recorded in said compatible information file to the user as information indicating a performance board to be mounted on said test head when none of the identification information recorded in said compatible information file correlatively with the type of said test module designated by the user coincides with the identification information obtained by said identification information obtaining section.

6. A computer-readable medium having stored thereon a diagnosing program which is executable by a processor, the diagnosing program comprising instructions for diagnosing test modules by a control unit in a test apparatus comprising the plurality of test modules that supply a test signal to a device-under-test, the control unit for controlling said plurality of test modules and a test head for carrying a testing performance board that carries said device-under-test and connects said mounted device-under-test with said plurality of test modules: wherein
said diagnosing program operates said control unit as:
a diagnosing program storage section for controlling diagnosis of a certain type of the object test module to be diagnosed by said control unit per type of the object test module to be diagnosed;
a file storage section for storing a compatible information file recording, per type of the object test module to be diagnosed, identification information of at least one mutually compatible diagnostic performance board to be mounted on said test head instead of said testing performance board to diagnose said object test module to be diagnosed by the respective object diagnosing program;

an identification information obtaining section for obtaining identification information of said diagnostic performance board when said diagnostic performance board is mounted on said test head;

an object diagnosing program executing section for executing said object diagnosing program corresponding to the type under the condition that at least one of the identification information recorded in said compatible information file correlatively with the type of said designated object test module to be diagnosed coincides with the identification information obtained by said identification information obtaining section.

7. A diagnosing method for diagnosing test modules by a control unit in a test apparatus comprising the plurality of test modules for supplying a test signal to a device-under-test, the control unit for controlling said plurality of test modules and a test head for carrying a testing performance board that carries said device-under-test and connects said mounted device-under-test with said plurality of test modules: wherein said control unit has a diagnosing program storage section for controlling diagnosis of a certain type of the object test module to be diagnosed by said control unit per type of the test module to be diagnosed; and a file storage section for storing a compatible information file recording identification information of at least one mutually compatible diagnostic performance board to be mounted on said test head instead of said testing performance board to diagnose said object test module to be diagnosed by the respective object diagnosing program per type of the object test module to be diagnosed; and said diagnosing method comprises an identification information obtaining step of obtaining identification information of said diagnostic performance board when said diagnostic performance board is mounted on said test head; and an object diagnosing program executing step of executing said object diagnosing program corresponding to the type under the condition that at least one of the identification information recorded in said compatible information file correlatively with the type of said designated object test module to be diagnosed coincides with the identification information obtained by said identification information obtaining section; and an outputting step of outputting a result of executing said object diagnosing program.

* * * * *